(12) United States Patent
Schram et al.

(10) Patent No.: US 9,634,675 B2
(45) Date of Patent: Apr. 25, 2017

(54) PHASE LOCKED LOOP WITH JUMP-FREE HOLDOVER MODE

(71) Applicant: Microsemi Semiconductor ULC, Kanata (CA)

(72) Inventors: Paul H. L. M. Schram, Bergen op zoom (NL); Krste Mitric, Ottawa (CA)

(73) Assignee: Microsemi Semiconductor ULC, Kanata, Ontario (CA)

( * ) Notice: Subject to any disclaimer, the term of this patent is extended or adjusted under 35 U.S.C. 154(b) by 0 days.

(21) Appl. No.: 15/064,626

(22) Filed: Mar. 9, 2016

(65) Prior Publication Data

US 2016/0294399 A1 Oct. 6, 2016

Related U.S. Application Data

(60) Provisional application No. 62/140,479, filed on Mar. 31, 2015.

(51) Int. Cl.
*H03L 7/00* (2006.01)
*H03L 7/091* (2006.01)
*H03L 7/093* (2006.01)
*H03L 7/099* (2006.01)

(52) U.S. Cl.
CPC .............. *H03L 7/091* (2013.01); *H03L 7/093* (2013.01); *H03L 7/0991* (2013.01)

(58) Field of Classification Search
CPC ........ H03L 7/091; H03L 7/093; H03L 7/0991
USPC ......... 327/156–159, 147–150; 375/371–376; 331/1 R, 1 A, 175
See application file for complete search history.

(56) References Cited

U.S. PATENT DOCUMENTS

2003/0137329 A1* 7/2003 Van Der Valk ......... H03L 7/093
327/156
2004/0208256 A1* 10/2004 Spijker ................... H03L 7/093
375/276

* cited by examiner

*Primary Examiner* — Thomas Skibinski
(74) *Attorney, Agent, or Firm* — Simon Kahn

(57) ABSTRACT

A phase locked loop with holdover mode has a loop filter for creating an offset frequency value for a controlled oscillator. The loop filter includes a register for storing the current offset frequency value the said controlled oscillator. A first multiplexer responsive to a holdover signal selects, depending on the quality of a reference signal, the output of the loop filter or a holdover queue to control the controlled oscillator. A second multiplexer responsive to the holdover signal selects for input to the register, depending on the quality of the reference signal, the sum of an output of the register and a value derived from the current phase difference between the output of the controlled oscillator and the reference signal or a current output value of the holdover queue.

7 Claims, 1 Drawing Sheet

PHASE LOCKED LOOP WITH JUMP-FREE HOLDOVER MODE

CROSS REFERENCE TO RELATED APPLICATION

This application claims the benefit under 35 USC 119(e) of prior U.S. provisional application No. 62/140,479 filed Mar. 31, 2015, the contents of which are herein incorporated by reference.

FIELD OF THE INVENTION

This invention relates to the field of telecommunications, and more particularly a phase locked loop with a jump-free holdover mode.

BACKGROUND OF THE INVENTION

In the field of telecommunications, Phase Locked Loops (PLLs) are used to generate clock signals based on filtered incoming reference clock signals. When the PLL output is following the reference input, this is referred to as the normal Locking mode. When a disturbance causes the incoming reference signal to be disqualified, the PLL goes into holdover mode based on a memorized frequency. This memorized frequency is of a certain age such that under normal circumstances it was stored before the disturbance on the reference clock occurred.

When the PLL is in holdover mode and the reference is again qualified, the PLL may switch back to the normal locking mode. When this happens, the output frequency is again taken from the PLL filter. The frequency stored in the PLL filter however will be not identical to the holdover frequency and this will cause a frequency step on the output. In most cases this step will be very small and within acceptable limits, but under certain conditions (e.g. in the presence of frequency slope limiters in the filter) it can get larger.

SUMMARY OF THE INVENTION

Embodiments of the invention will avoid this frequency step by replacing the frequency stored in the loop filter with the frequency used for holdover before switching back to the normal locking mode. As a result the PLL starts tracking the reference frequency from the holdover frequency and will not produce a frequency step on the output.

According to the present invention there is provided a phase locked loop with holdover mode, comprising: a controlled oscillator for generating an output signal; a phase detector for comparing a reference signal with said output signal to produce a current phase difference; a loop filter for creating an offset frequency value for said controlled oscillator, said loop filter including a register for storing the current offset frequency value for said controlled oscillator; a holdover queue for storing historical frequency offset values; a first multiplexer responsive to a holdover signal to select, depending on the quality of said reference signal, the output of said loop filter or holdover queue to control said controlled oscillator; and a second multiplexer responsive to said holdover signal to select for input to said register, depending on the quality of said reference signal, the sum of an output of said register and a value derived from the current phase difference or a current output value of the holdover queue.

The PPL may be a second order type II PLL with a proportional and integrator branches in the loop filter. The proportional and integrator branches are added together to produce the signal controlling the digital controlled oscillator during normal operation.

The integrator branch may include a register and adder with the output of the register fed back to the adder. During holdover mode the output of the holdover queue is fed to the input of the register instead of the output of the adder.

In another aspect the invention provides a method of preventing frequency jumps in a phase locked loop during return to normal operation after being placed in a holdover mode, wherein the phase locked loop has a loop filter including a register storing a current frequency offset value and a holdover queue providing an frequency offset value for use when a reference signal is disqualified, the method comprising: feeding the output of the holdover queue to the register during a holdover operation so that when normal operation is restored the current frequency offset value output by the register is the same as that as the holdover queue.

BRIEF DESCRIPTION OF THE DRAWINGS

The invention will now be described in more detail, by way of example only, with reference to the accompanying drawings, in which.

DETAILED DESCRIPTION OF PREFERRED EMBODIMENTS

Figure 1:
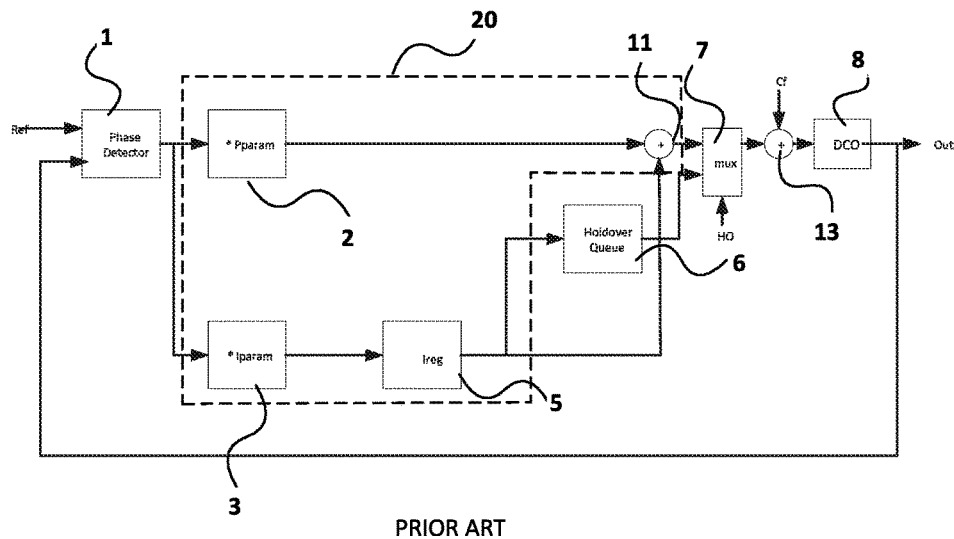
FIG. 1 is a block diagram showing a prior art implementation of a holdover function implemented in a type II PLL.

In the drawings, like parts are referenced with like or similar reference numerals.

In the prior art second order type II PLL illustrated in FIG. 1, a phase detector 1 compares a reference signal with a feedback signal obtained from the output of digital controlled oscillator (DCO) 8 via a feedback line to determine the phase difference between the reference signal and the output signal. The entire PLL is under the control of a system clock.

As is known in the art, the type II PPL has a loop filter 20 comprising a proportional branch and an integrator branch. The proportional branch contains multiplier block 2, which multiplies the detected phase difference by a proportional parameter Pparam, which also converts the phase difference to the frequency domain. The integrator branch contains multiplier block 3, which multiplies the phase difference by an integral parameter Iparam, and an integrator 5, which integrates over time the input fed into it from multiplier block 3. Integral parameter Iparam similarly converts the phase difference to the frequency domain.

The proportional branch contains no memory and determines the primary bandwidth of the PLL. The integrator branch has a memory in the form of the integrator 5, which holds the filtered frequency offset for the DCO 8.

The output of integrator 5 is passed to an adder 11, where it is added to the output of the multiplier block 2. The output of adder 11 is fed to a mux 7 whose output is passed to an adder 13, where the center frequency signal Cf represents the nominal frequency of the second order type II PLL, from where it is passed to the control input of DCO 8. Adder 13 adds the output of mux 7 to a center frequency signal Cf so as to control DCO 8. In normal operation the signal HO, received at a control input at mux 7, is not asserted and the output of the loop filter 20 controls the DCO 8.

The output of the integrator 5 is also passed to holdover queue 6. This is in the form of a first in first out memory (FIFO) with at least two buffer locations. During normal operation the output value of the integrator 5, representing the current frequency offset, is fed to the holdover queue at regular intervals, for example, a predetermined number of system cycles. The update rate and the size of the FIFO determine the age of the holdover value fed at the output of holdover queue 6 to e mux 7. These are selected such that the current frequency offset output by the holdover queue 6 represents the frequency offset at a certain time sufficiently in the past such that the current frequency offset output by the holdover queue 6 is likely to be from a time before the start of an event that caused the reference signal to be disqualified, or in other words from a time when the reference signal was still valid.

The output of the holdover queue 6 is fed to the input of mux 7. When the holdover signal HO is asserted, in response to the detection of a disqualified reference signal, the current output of the holdover queue 6 is applied to the adder 13 instead of the output of the adder 11 so that the DCO 8 holds a frequency based on the value stored in the holdover queue 6.

When the HO signal is released, due to the reference signal being restored to acceptable quality, the mux switches the input to the adder 13 back to the output of the adder 11 so that the DCO 8 once again tracks the reference signal via the loop filter 20. As noted the current offset frequency determined by integrator block 5 can be different from the frequency output by the holdover queue 6, and in certain circumstances this fact can cause an unacceptable frequency jump.

Figure 2:
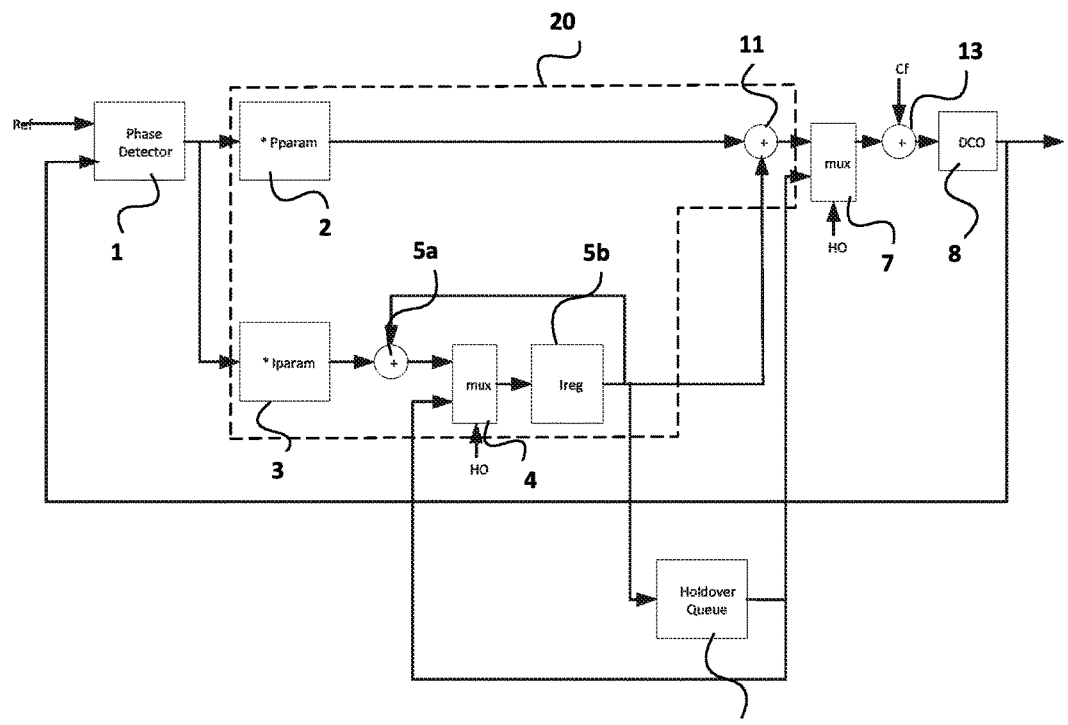
FIG. 2 is a block diagram of an embodiment in accordance with the invention.

In the embodiment shown in FIG. 2, the holdover queue 6 also sends its output to the input of mux 7, which is controlled by the holdover signal HO.

In FIG. 2, the component parts of the integrator, which in FIG. 1 is referenced 5, are shown separately as adder 5*a* and Ireg register 5*b*. The output of multiplier block 3 is passed to the adder 5*a*, where it is added to the output of the Ireg register 5*b* and the output of adder 5*a* is passed to a first input of a mux 4.

In normal operation when the holdover signal is not asserted, the output of the loop filter 20 controls the DCO 8 in the same manner as described above in relation to FIG. 1. The offset frequency values are also input to the holdover queue 6 from the output of Ireg register 5*b* at regular intervals to build up the holdover history. The oldest stored value of the holdover queue 6 is presented at its output.

When the holdover signal HO is asserted, the mux 7 selects the output of the holdover queue 6 instead of the output of the adder 11, so that the DCO 8 is presented with the sum of the frequency signal Cf and the output of the holdover queue 6.

Additionally, when holdover signal HO is asserted, mux 4 selects the output of the holdover queue 6 for presentation to the Ireg register 5*b* until the end of the holdover operation. This ensures that when the PLL returns to normal operation, the frequency offset value stored in the register 5*b* is the same as that output by the holdover queue 6. As a result, no frequency jump occurs when the input to the mux 7 is switched back to the loop filter 20, since the output of register 5*b* maintains the holdover frequency.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. A phase locked loop with holdover mode, comprising:
  a controlled oscillator for generating an output signal;
  a phase detector for comparing a reference signal with said output signal to produce a current phase difference;
  a first multiplexer providing an output controlling said controlled oscillator;
  a loop filter for creating, during normal operation, an frequency offset value for said controlled oscillator, said loop filter comprising a proportional branch with a first multiplier for multiplying said current phase difference by a first parameter, an integrator branch, and a first adder having a first input coupled to an output of said proportional branch, said integrator branch including a second multiplier for multiplying said current phase difference by a second parameter, a register for storing a current frequency offset value for said controlled oscillator, a second adder for adding an output of said register to an output of said second multiplier, and a second multiplexer, an output of said second adder being coupled to a first input of said second multiplexer, and an output of said first multiplier coupled to a first input of said first multiplexer;
  a holdover queue for storing historical frequency offset values, said holdover queue having an input coupled to an output of said register, and an output coupled to said second input of said first multiplexer and a second input of said second multiplexer;
  said first multiplexer being operative during said normal operation to select said first input thereof to provide said output controlling said controlled oscillator, and said first multiplexer being responsive to assertion of a holdover signal in said holdover mode upon disqualification of said reference signal to select said second input thereof to provide said output controlling said controlled oscillator; and
  said second multiplexer being operative during normal operation to select said first input thereof for input to said register and being responsive to assertion of said holdover signal in said holdover mode to select said second input thereof for input to said register.

2. The phase locked loop with holdover mode as claimed in claim 1, further comprising a third adder for adding the output of said first multiplexer to a predetermined center frequency.

3. The apparatus as claimed in claim 1, wherein said holdover queue is a first-in first-out (FIFO) memory.

4. A method of preventing frequency jumps in a phase locked loop during return to normal operation after being placed in a holdover mode, wherein during normal operation said phase locked loop is locked to a reference signal, wherein when said reference signal is disqualified, said phase locked loop operates in said holdover mode, and wherein said phase locked loop has a loop filter including a register storing a current frequency offset value for use during said normal operation and a holdover queue for storing historical frequency offset values and providing a frequency offset value replacing the frequency offset value provided by said loop filter for use when said phase locked loop is in said holdover mode, the method comprising:

feeding the output of the holdover queue to the register during said holdover mode so that when normal operation is restored the current frequency offset value output by the register is the same as the frequency offset value provided by the holdover queue.

5. The method as claimed in claim 4, wherein during said normal operation the input to the register is the output of an adder, and in said holdover mode the input to the register is the output of the holdover queue.

6. The method as claimed in claim 5, wherein the phase difference between the reference signal and the output of the controlled oscillator multiplied by a predetermined constant is applied to the input of said adder.

7. The method as claimed in claim 5, wherein said adder and said register together make an integrator producing said current frequency offset values.

\* \* \* \* \*